United States Patent [19]
Abe et al.

[11] Patent Number: 6,037,638
[45] Date of Patent: Mar. 14, 2000

[54] SEMICONDUCTOR MEMORY DEVICE

[75] Inventors: Mitsuhiro Abe, Kawasaki; Yoichi Suzuki; Makoto Segawa, both of Yokohama, all of Japan

[73] Assignee: Kabushiki Kaisha Toshiba, Kawasaki, Japan

[21] Appl. No.: 09/034,316

[22] Filed: Mar. 4, 1998

[30] Foreign Application Priority Data

Mar. 4, 1997 [JP] Japan ................................. 9-063903

[51] Int. Cl.[7] ........................... H01L 29/76; H01L 24/11
[52] U.S. Cl. ..................... 257/393; 257/903; 257/904
[58] Field of Search ................................ 257/393, 903, 257/904

[56] References Cited

U.S. PATENT DOCUMENTS 5,818,089  10/1998  Kokubo et al. ......................... 257/904

*Primary Examiner*—Steven H. Loke
*Attorney, Agent, or Firm*—Foley & Lardner

[57] ABSTRACT

The gates 31, 32, 33 and 34 of a pair of driver transistors Q1, Q2 and a pair of address-selecting transistors Q3, Q4 are arranged so as to be perpendicular to bit lines BL, /BL. The drain regions of the driver transistors Q1, Q2 forming a flip-flop are arranged point-symmetrically around an element isolating region. The source regions of the driver transistors Q1, Q2 are arranged point-symmetrically. Similarly, the address-selecting transistors Q3, Q4 are arranged point-symmetrically. An upper wiring layer connected to two gates of the transistors are arranged so as to be perpendicular to the bit lines BL, /BL. Two Vss lines are formed in the same layer as that for the bit lines BL, /BL and arranged on both sides of the bit lines BL, /BL in parallel thereto. The Vss lines are connected to the source regions of the driver transistors. With this construction, the bi-stability of a memory cell used for a semiconductor memory device, such as a SRAM, is improved, so that the low-voltage operation and the hold characteristic are improved and software errors are removed. In addition, the aspect ratio of the cell is changed from the aspect ratio of a conventional, longitudinally extending cell to the aspect ratio of a laterally extending cell, so that the lengths of the bit lines are decreased to achieve a high speed operation.

11 Claims, 15 Drawing Sheets

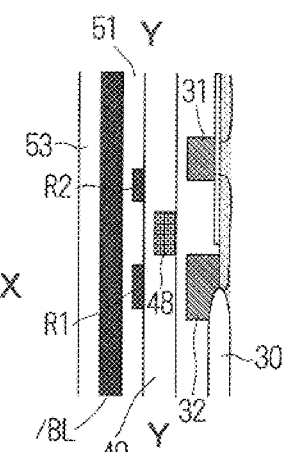
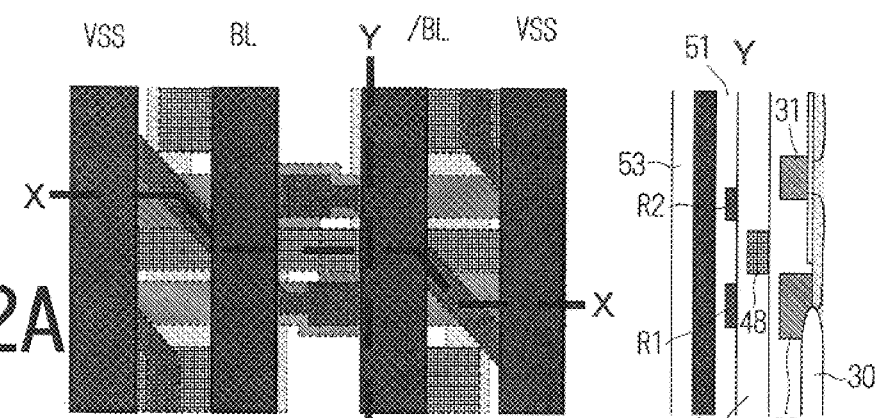
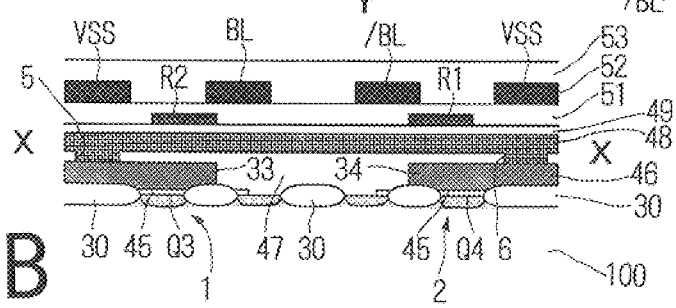
FIG.12A
FIG.12B
FIG.12C

SEMICONDUCTOR MEMORY DEVICE

BACKGROUND OF THE INVENTION

1. Field of The Invention

The present invention relates generally to a semiconductor memory device. More specifically, the invention relates to a memory cell of a static RAM (SRAM) formed on a semiconductor substrate.

2. Description of The Background Art

FIG. 23 is a circuit diagram of a memory cell of a conventional four-transistor, two-register type SRAM. In FIG. 23, first and second MOS transistors Q1, Q2 form a pair of driver transistors. The drain region of one of the driver transistors Q1, Q2 is connected to the gate of the other transistor. As load elements for the respective transistors Q1, Q2, resistors R1, R2 of, e.g., a polysilicon film, are connected to the transistors Q1, Q2 to form a flip-flop circuit. One ends of the resistors R1, R2 are commonly connected to a Vcc terminal. The source regions of the driver transistors Q1, Q2 are connected to a Vss terminal. First and second nodes of the flip-flop circuit are connected to first and second bit lines BL, /BL ("/" denotes an inverting sign) via the address-selecting transistors serving as third and fourth MOS transistors Q3, Q4, respectively. When a memory cell is selected to carry out writing or readout, the address-selecting transistors Q3, Q4 are turned ON to transmit information between the bit lines BL, /BL and the flip-flop circuit. The gates of the address-selecting transistors Q3, Q4 are commonly connected to a word line WL. The transistors may be either of n-type and p-type transistors.

A conventional semiconductor memory device having such a circuit construction is formed and arranged on a semiconductor substrate as shown in FIG. 24. FIG. 24 is a plan view of a semiconductor substrate, on which a SRAM cell is formed. In FIG. 24, element regions 1, 2 are arranged point-symmetrically on the upper and lower sides of an element isolating region. The driver transistors Q1, Q2 are arranged point-symmetrically around the element isolating region. The gates 31, 32 of the transistors Q1, Q2 are arranged in parallel to the bit lines BL, /BL. The address-selecting transistors Q3, Q4 are arranged point-symmetrically on the upper and lower sides of the driver transistors Q1, Q2 to be connected to the first and second bit lines BL, /BL, respectively. The gates 33, 34 of the transistors Q3, Q4 are perpendicular to the bit lines BL, /BL. The gates 33, 34 of the transistors Q3, Q4 are connected to a common word line WL. The Vcc line connected to one ends of the resistors R1, R2 and the Vss line connected to the source regions of the driver transistors Q1, Q2 are arranged in parallel to the word lines WL.

However, if the miniaturization, assurance of low-voltage operation and accelerating of the conventional semiconductor memory device are required, there are the following disadvantages in longitudinal and lateral directions.

[Disadvantages in Lateral Direction]

Comparing the proportion of the driver transistors Q1, Q2 or element isolating region reduced by the fine patterning with the proportion of an upper layer, such as an aluminum wiring layer, reduced by the fine patterning, the latter is smaller than the former due to the thickness and difference in level of the upper layer. Therefore, if the channel lengths of the driver transistors Q1, Q2 are reduced, the widths of the bit lines formed in the aluminum wiring layer and the space between the bit lines must be decreased. As a result, the resistance of the bit lines increases, the parasitic capacity increases under the influence of the adjacent bit lines, and the characteristic deteriorates under the influence of coupling and so forth. In addition, the disconnection or short-circuit between the bit lines may occur to decrease the yield.

[Disadvantages in Longitudinal Direction]

In the case of a monolayer aluminum structure, the bit lines are formed in the aluminum wiring layer, and the Vss line is formed of polysilicon or the like. The resistance of the Vss line is determined by the sheet resistance, width and length of the material thereof. For example, if the proportion of the width reduced by the fine patterning is greater than the proportion of the length reduced by the fine patterning, the resistance of the Vss line increases. This deteriorates the stability of the memory cell. In order to eliminate this problem, the number of the Vss lines, which extend in parallel to the bit lines every a plurality of cells and which are formed in the aluminum wiring layer, may be increased. However, in this case, there is a problem in that the size of the chip increases. In addition, when the gates of the address-selecting transistors are commonly connected, it is required to provide two word lines on the upper and lower sides. When the wiring is provided in the same layer as that of the gates, it is required to form a wiring region so as not to overlap with a region wherein the driver transistors Q1, Q2 are formed, so that the reduction of the cell size is prevented. If the wiring layer is formed in a layer different from the layer for the gates, e.g., in the same layer as that for the Vss line, it is not possible to ensure a desired wiring width, so that the resistance of the Vss line and the resistance of the word line are increased. In addition, the aspect ratios of contacts for connecting the bit lines formed in the aluminum wiring layer to the address-selecting transistors Q3, Q4 are decreased as the fine patterning proceeds. Therefore, the bit lines may contact the diffusion layer region for the address-selecting transistors Q3, Q4 after being connected to the underlayer of polysilicon. However, this disturbs the Vss line wiring region.

In addition, the size of the long edge of the cell is prevented from reducing, and it is not possible to decrease the lengths of the bit lines, so that the accelerating is prevented.

SUMMARY OF THE INVENTION

It is therefore an object of the present invention to eliminate the aforementioned problems and to provide a semiconductor memory device, such as a SRAM, which can improve the low-voltage operation and hold characteristics thereof and remove software errors by improving the bi-stability of a memory cell used for the semiconductor memory device, and which can be operated at a high speed by decreasing the lengths of bit lines by changing the aspect ratio of the cell from the aspect ratio of the conventional, longitudinally extending cell to the aspect ratio of a laterally extending cell.

In order to accomplish the aforementioned and other objects, according to one aspect of the present invention, there is provided a semiconductor memory device having a memory cell formed on a semiconductor substrate, said memory cell comprising:

a flip-flop including a first and second load elements and a pair of driver transistors, said a pair of driver transistors including a first MOS transistor and a second MOS transistor, a gate of said first MOS transistor being connected to a drain of said second MOS transistor and a gate of said second MOS transistor being connected to a drain of said first MOS transistor, each of said first and second MOS transistors having a source connected to a low-voltage-side power supply line, and one end of said first load element being connected to said drain of said first MOS transistor and the other end thereof being connected to a high-voltage-side power supply line, one end of said second load element being connected to said drain of said second MOS transistor and the other end thereof being connected to said high-voltage-side power supply line; and a pair of address-selecting transistors including a third MOS transistor and a fourth MOS transistor, one of a source and a drain of the fourth MOS transistor being connected to a first bit line and the other of the source and the drain of the fourth MOS transistor being connected to the drain of the first MOS transistor, one of a source and a drain of the third MOS transistor being connected to a second bit line and the other of the source and the drain of the third MOS transistor being connected to the drain of the second MOS transistor, wherein the first and second bit lines and the high-voltage-side and low-voltage-side power supply lines extend in a predetermined direction, the directions of channel lengths of the first, second, third and fourth MOS transistors being the same as the predetermined direction, all of elements of the memory cell being arranged point-symmetrically with respect to a central point on a plane of a memory cell forming region on the semiconductor substrate.

The first and second MOS transistors may be arranged point-symmetrically with respect to the central point on the plane of the memory cell forming region on the semiconductor substrate. The third and fourth MOS transistors may be arranged point-symmetrically with respect to the central point on the plane of the memory cell forming region on the semiconductor substrate. The first and second load elements may be arranged point-symmetrically with respect to the central point on the plane of the memory cell forming region on the semiconductor substrate.

The semiconductor memory device may further comprise: an insulating film formed so as to coat the gate of the pair of address-selecting MOS transistors; and a word line, formed on the insulating film, for connecting the gate of the address-selecting MOS transistors to each other.

The bit lines and the low-voltage-side power supply line may be formed in a conductive layer formed in a process for producing the semiconductor memory device.

The semiconductor memory device may further comprise a pair of low-voltage-side power supply lines arranged at both ends of the memory cell, the pair of bit lines being connected between the pair of low-voltage-side power supply lines.

The conductive layer may be an aluminum layer. The high-voltage-side power supply line and the load elements may be formed by a polysilicon conductive layer in the process for producing the semiconductor memory device, and use a power supply line region and a polysilicon resistor, which are formed by the ion implantation. The load element may be a TFT load type transistor. A plurality of memory cells may be arranged on the semiconductor substrate in the form of a matrix.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 12A–12C are plan views, is a sectional views of a semiconductor substrate, on which a SRAM of the present invention is formed;

DESCRIPTION OF THE PREFERRED EMBODIMENTS

Figure 1A:
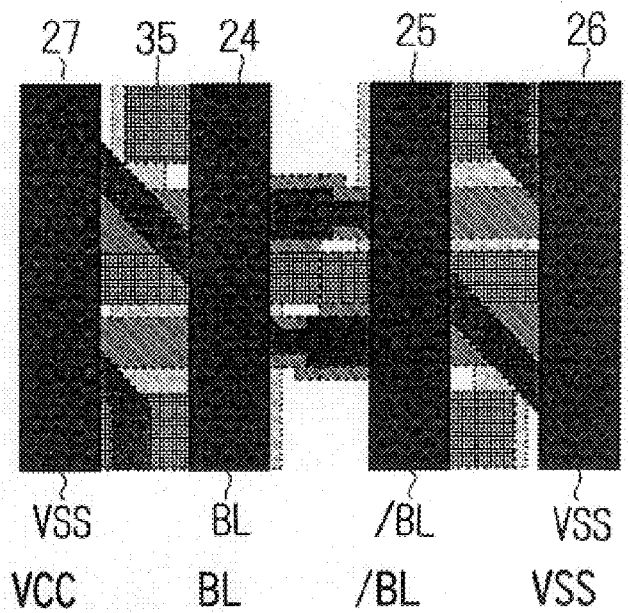
FIGS. 1A–1C are plan views of a semiconductor substrate, on which a SRAM of the present invention is formed.
Figure 1B:
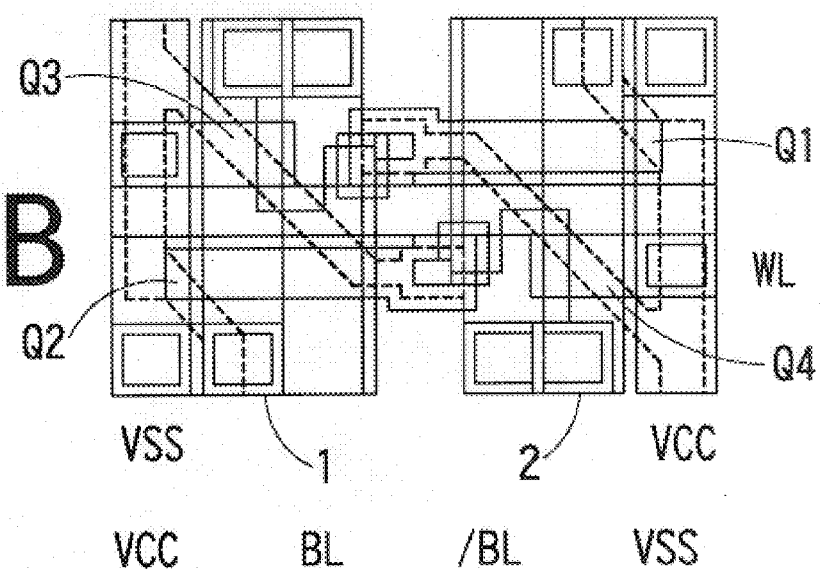
Figure 1C:
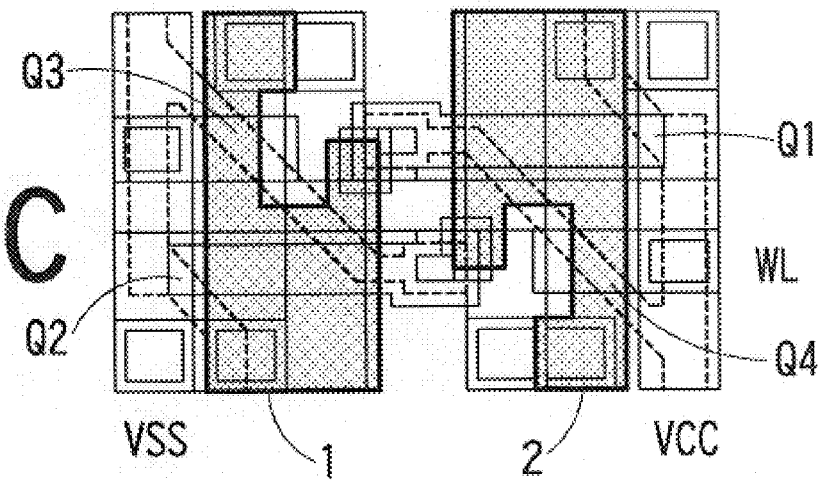
Figure 2:
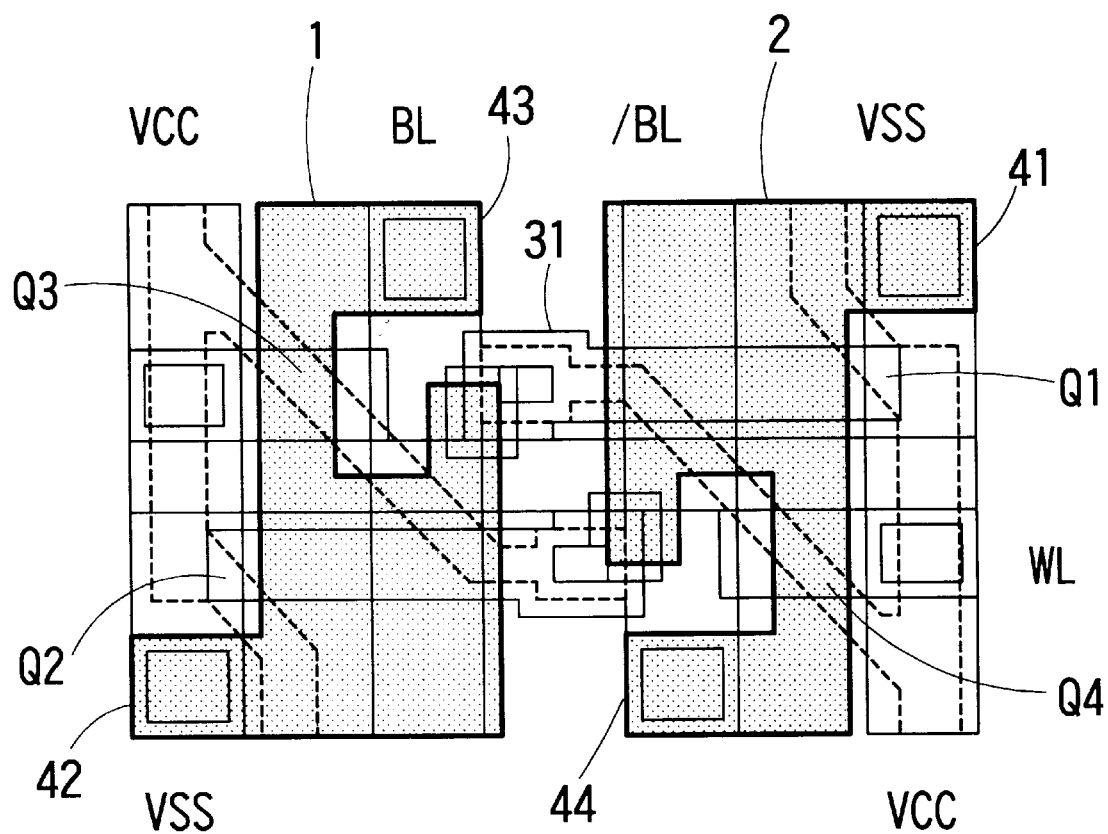
FIG. 2 is a plan view of a semiconductor substrate, on which a SRAM of the present invention is formed.

Referring now to the accompanying drawings, the preferred embodiments of a semiconductor memory device according to the present invention will be described below. FIG. 1B is a fluoroscopy drawing of FIG. A, and FIG. 1C is obtained by adding dots into FIG. 1B, FIG. 2 is also added dots as FIG. 1C.

First, referring to FIGS. 1A–1C and 2, the first preferred embodiment of a semiconductor memory device according to the present invention will be described below. FIG. 1B is a fluoroscopy drawing of FIG. 1A, and FIG. 1C is obtained by adding dots into FIG. 1B, FIG. 2 is also added dots as FIG. 1C.

As shown in FIG. 1, the gates 31, 32, 33 and 34 of a pair of driver transistors Q1, Q2 and a pair of address-selecting transistors Q3, Q4 are arranged so as to be perpendicular to bit lines BL, /BL. The drain regions of the driver transistors Q1, Q2 forming a flip-flop are arranged point-symmetrically around an element isolating region. The source regions of the driver transistors Q1, Q2 are arranged point-symmetrically. Similarly, the address-selecting transistors Q3, Q4 are arranged point-symmetrically. An upper wiring layer connected to the two gates of the transistors Q3, Q4 is arranged so as to be perpendicular to the bit lines BL, /BL. Two Vss lines are formed in the same layer as that of the bit lines BL, /BL and arranged on both side of the bit lines BL, /BL so as to be in parallel thereto. The Vss lines are connected to the source regions of the driver transistors Q1, Q2. Resistor elements R1, R2 intersect the bit lines BL, /BL so as to be inclined by about 45 degrees from the bit lines BL, /BL. Power supply lines Vcc are connected to one ends of the resistor elements R1, R2 and arranged in parallel to the bit lines BL, /BL.

Referring to FIGS. 3 through 11, the layout of each layer in the first preferred embodiment and a process for producing the first preferred embodiment of a semiconductor memory device according to the present invention will be described below. All of these figures show plan views of the surface region of a semiconductor substrate.

Figure 3:
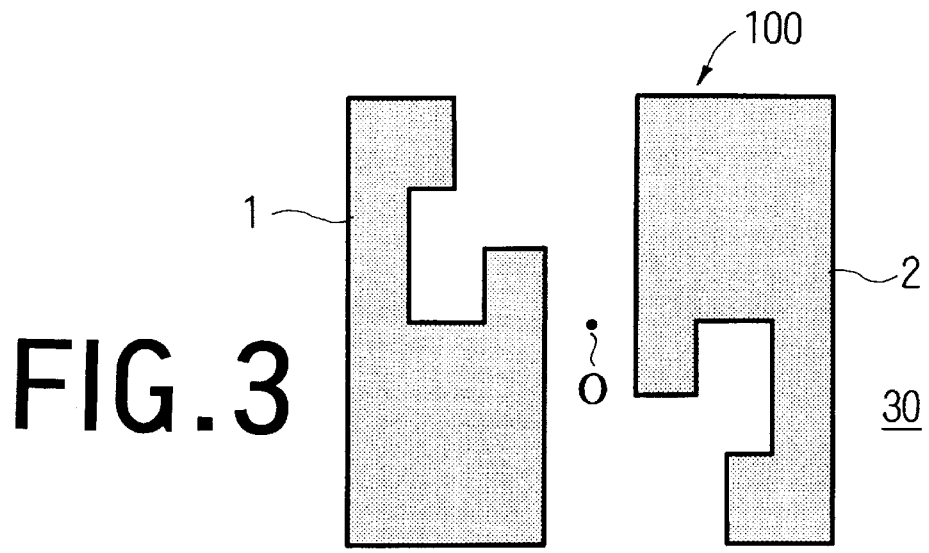
FIG. 3 is a plan view of a semiconductor substrate for explaining a process for producing a SRAM according to the present invention.

First, as shown in FIG. 3, an element isolating region 30 of a field oxide film or the like is formed in the surface region of a semiconductor substrate 100. Regions 1 and 2 other than the element isolating region serve as element forming regions wherein driver transistors Q1, Q2 and address-selecting transistors Q3, Q4 are formed. The element forming regions 1, 2 are arranged point-symmetrically with respect to point O in the element isolating region.

Figure 4:
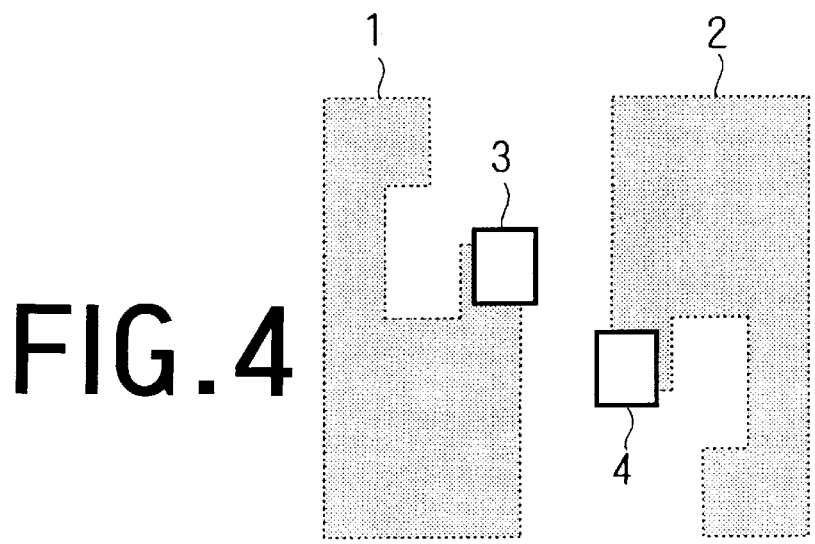
FIG. 4 is a plan view of a semiconductor substrate for explaining a process for producing a SRAM according to the present invention.

Then, as shown in FIG. 4, an insulating film coating the surface of the semiconductor substrate 100 is etched so as to allow a part of each of the element forming regions 1, 2 to be exposed, so that openings 3, 4 are formed. The opening 3 allows the part of the element forming region 1 to be exposed, and the opening 4 allows the part of the element forming region 2 to be exposed. After this figure, no semiconductor substrate is shown.

Figure 5:
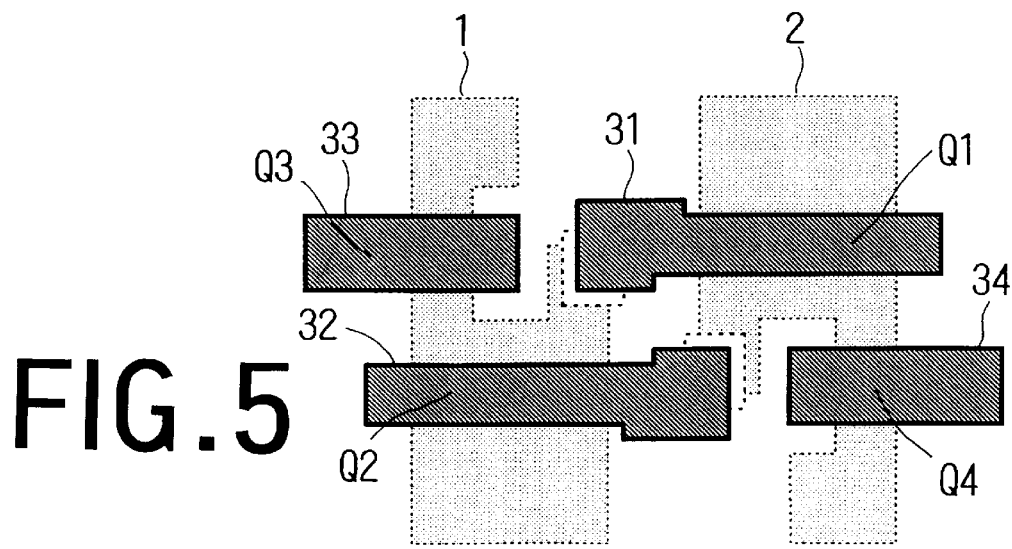
FIG. 5 is a plan view of a semiconductor substrate for explaining a process for producing a SRAM according to the present invention.

Then, as shown in FIG. 5, a first layer of polysilicon film is formed on the insulating film and patterned to form first and second MOS transistors Q1, Q2, which serve as driver transistors and which have gates 31, 32, and third and fourth MOS transistors Q3, Q4, which serve as address-selecting transistors and which have gates 33, 34. The element forming region 1 is electrically connected to the gate 31 of the driver transistor Q1 via the opening 3, and the element forming region 2 is electrically connected to the gate 32 of the driver transistor Q2 via the opening 4. These transistors may be either of n-type and p-type transistors.

Figure 6:
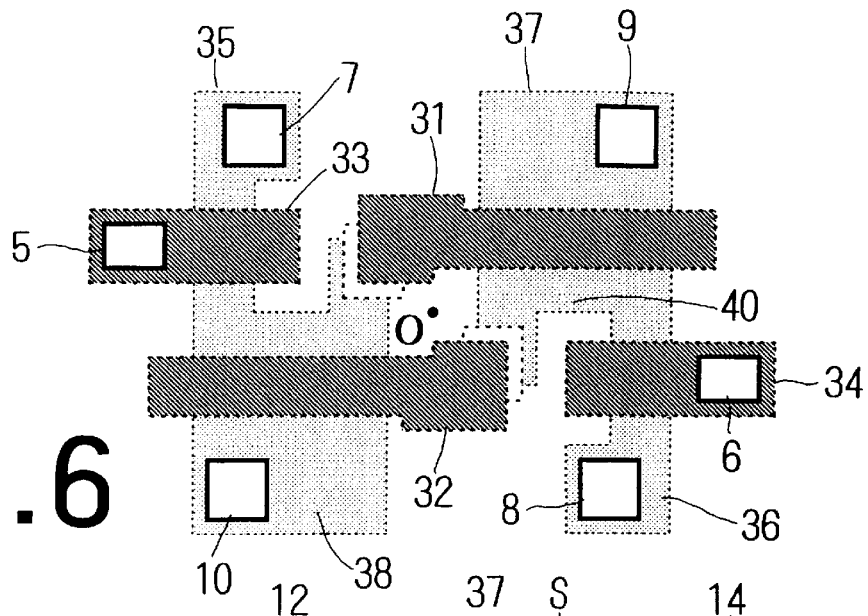
FIG. 6 is a plan view of a semiconductor substrate for explaining a process for producing a SRAM according to the present invention.

Then, as shown in FIG. 6, a first interlayer insulating film of $CVDSiO_2$ or the like is formed on the semiconductor substrate so as to coat the gates of the transistors. Then, an opening 5 is formed in the first interlayer insulating film above the gate 33 of the address-selecting transistor Q3, and an opening 6 is formed in the first interlayer insulating film above the gate 34 of the address-selecting transistor Q4. In addition, an opening 7 is formed in the first interlayer insulating film above the source region 35 of the address-selecting transistor Q3, and an opening 8 is formed in the first interlayer insulating film above the source region 36 of the address-selecting transistor Q4. Moreover, an opening is formed in the first interlayer insulating film above the source region 37 of the driver transistor Q1, and an opening 10 is formed in the first interlayer insulating film above the source region 38 of the driver transistor Q2.

Figure 7:
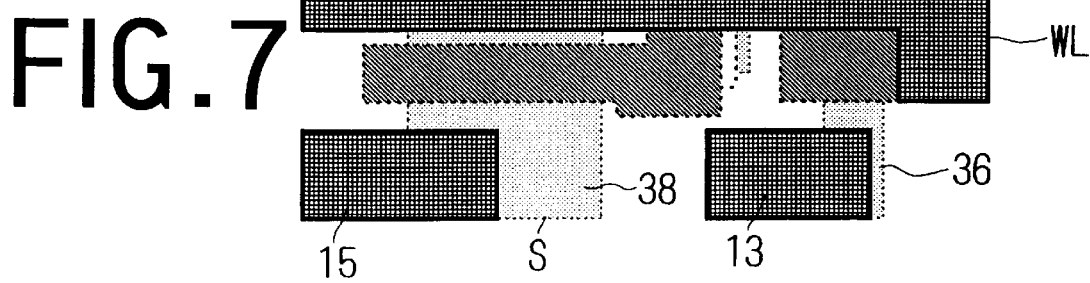
FIG. 7 is a plan view of a semiconductor substrate for explaining a process for producing a SRAM according to the present invention.
Figure 8:
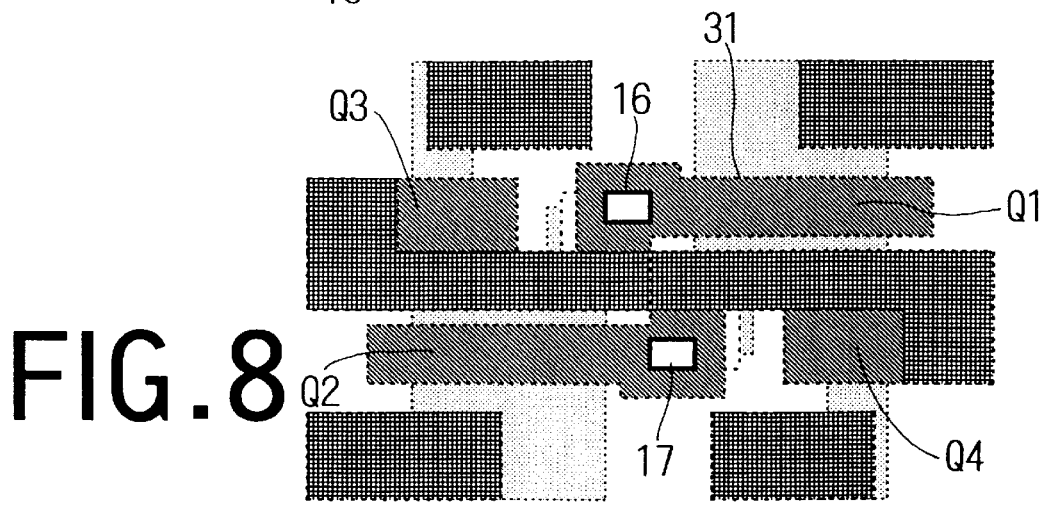
FIG. 8 is a plan view of a semiconductor substrate for explaining a process for producing a SRAM according to the present invention.

The gate 31 of the driver transistor Q1 is connected to a region 39 serving as the drain regions of the driver transistor Q2 and the address-selecting transistor Q3, which are formed in the element forming region 1 via the opening 3 of the insulating film shown in FIG. 4. That gate 32 of the driver transistor Q2 is connected to a region 40 serving as the drain regions of the driver transistor Q1 and the address-selecting transistor Q4, which are formed in the element forming region 2 via the opening 4 of the insulating film shown in FIG. 4. Then, as shown in FIG. 7, a second layer of polysilicon film is deposited on the first interlayer insulating film and patterned to form polysilicon wires 11 through 15. The wire 11 connects the gates 33, 34 of the address-selecting transistors Q3, Q4 to each other via the openings 5, 6. The wire 11 is used as the word line WL. The wires 12, 13 are electrically connected to the source regions 35, 36 of the address-selecting transistors Q3, Q4 via the openings 7, 8, respectively. The wires 14, 15 are electrically connected to the source regions 37, 38 of the driver transistors Q1, Q2 via the openings 9, 10, respectively. Then, as shown in FIG. 8, a second interlayer insulating film is formed on the semiconductor substrate to coat the wires 11 through 15 formed at the step shown in FIG. 7. Then, openings 16, 17 are formed in the second interlayer insulating film above the gates 31, 32 formed by patterning the first layer of polysilicon film.

Figure 9:
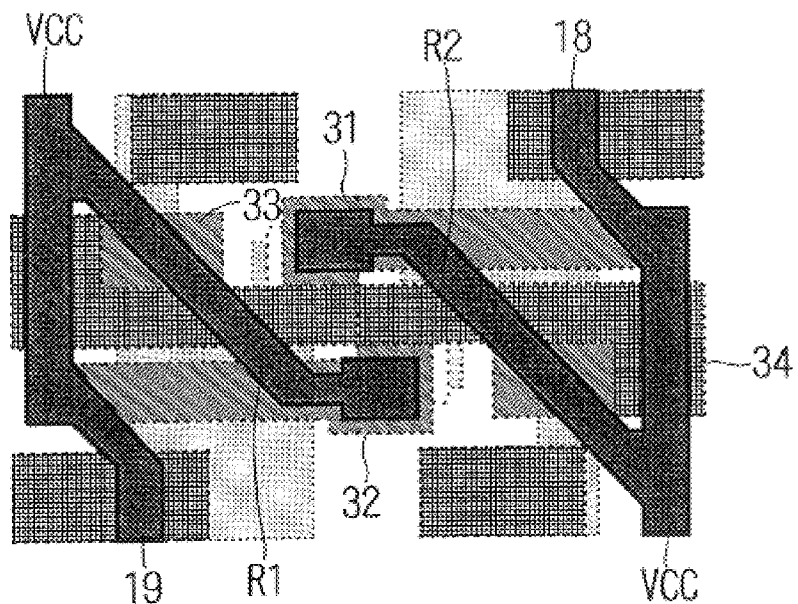
FIG. 9 is a plan view of a semiconductor substrate for explaining a process for producing a SRAM according to the present invention.

Then, as shown in FIG. 9, a third layer of polysilicon film is deposited on the second interlayer insulating film and patterned to form wires 18, 19. The wire 18 includes the resistive element R2 and the power supply line Vcc. The resistive element R2 is electrically connected to the gate 31 of the driver transistor Q1 via the opening 16. The wire 19 includes the resistive element R1 and the power supply line Vcc. The resistive element R1 is electrically connected to the gate 32 of the driver transistor Q2 via the opening 17. The resistive elements R1, R2 are inclined by 45 degrees with respect to the corresponding gates, respectively. The regions for the resistive elements R1, R2 and the power supply lines Vcc are formed by the ion-implantation in desired regions (not shown).

Thus, if the resistive elements R1, R2 are inclined by 45 degrees with respect to the corresponding gates, the maximum lengths of the resistive elements can be obtained.

Figure 10:
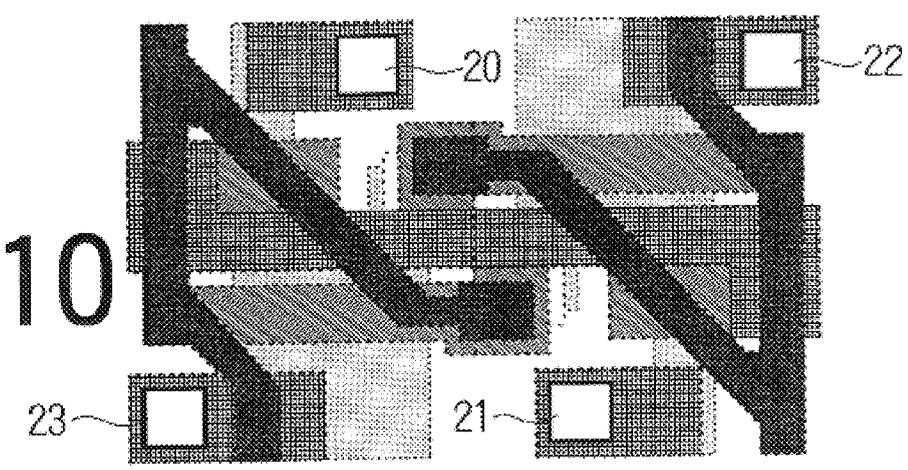
FIG. 10 is a plan view of a semiconductor substrate for explaining a process for producing a SRAM according to the present invention.

Then, as shown in FIG. 10, a third interlayer insulating film is formed on the semiconductor substrate so as to coat the wires 18, 19. This interlayer insulating film is etched to form openings 20 through 23 above the wires 12 through 15 formed in the second layer of polysilicon film. Then, a first layer of an aluminum film is formed on the third interlayer insulating film and patterned to form wires 24 through 27.

Figure 11:
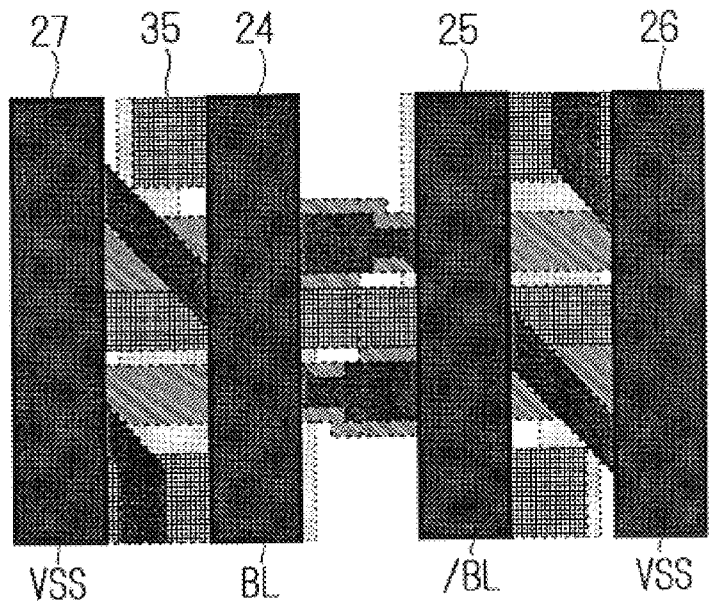
FIG. 11 is a plan view of a semiconductor substrate for explaining a process for producing a SRAM according to the present invention.

The wire 24 serves as the bit line BL, and the wire 25 serves as the bit line /BL. The wires 26, 27 serve as earthing wires Vss. As shown in FIG. 11, the bit line (BL) 24 is connected to the source region 35 of the address-selecting transistor Q3 via the opening 20, the wire 12 and the opening 7. The bit line (/BL) 25 is connected to the source region 36 of the address-selecting transistor Q4 via the opening region 21, the wire and the opening 8. The earthing wire (Vss) 26 is connected to the source region 37 of the driver transistor Q1 via the opening 22, the wire 14 and the opening 9. The earthing wire (Vss) 27 is connected to the source region 38 of the driver transistor Q2 via the opening 23, the wire 15 and the opening 10 to serve as the earthing wire Vss.

Referring to FIGS. 12A–12C, the wiring structure on the semiconductor substrate will be described below. FIGS. 12B and 12C are sectional views of FIG. 12A where the address-selecting transistors Q1, Q2 are formed.

On the semiconductor substrate 100 of silicon, the element isolating region 30 of a field oxide film ($SiO_2$) is formed. On the element 10 regions 1, 2, the insulating film ($SiO_2$) 45 serving as a gate oxide film is formed. On the element region 1, the transistor Q3 is formed, and on the element region 2, the transistor Q4 is formed. On the element regions 1, 2, the gates 33, 34 of the address-selecting transistors obtained by patterning the first layer of polysilicon film 46 is formed. The first interlayer insulating film 47 of $CVDSiO_2$ or the like is formed on the semiconductor substrate 100 so as to coat the gates of the transistors. The opening 5 is formed in the first interlayer insulating film 47 above the gate 33 of the transistor Q3, and the opening 6 is also formed in the first insulating film 47 above the gate 34 of the transistor Q4. The second layer of polysilicon film 48 is deposited on the first interlayer insulating film 47 and patterned to form the wire 11 for connecting the gates 33, 34 of the transistors Q3, Q4 to each other via the opening 56. The wire 11 is used as the word line WL. The second interlayer insulating film 49 is formed on the semiconductor substrate to coat the second layer of polysilicon film 48.

The third layer of polysilicon film 50 is deposited on the second interlayer insulating film 49 and patterned to form a plurality of wires. These wires include the resistive element R2, R1. The third interlayer insulating film 51 is formed on the semiconductor substrate 100 so as to coat these wires. The first layer of aluminum film 52 is formed on the third interlayer insulating film 51 and patterned to form the bit lines BL, /BL and the earthing wires Vss. A protective insulating film 53 of BPSG or the like is formed so as to coat the first layer of aluminum film 52.

Figure 13:
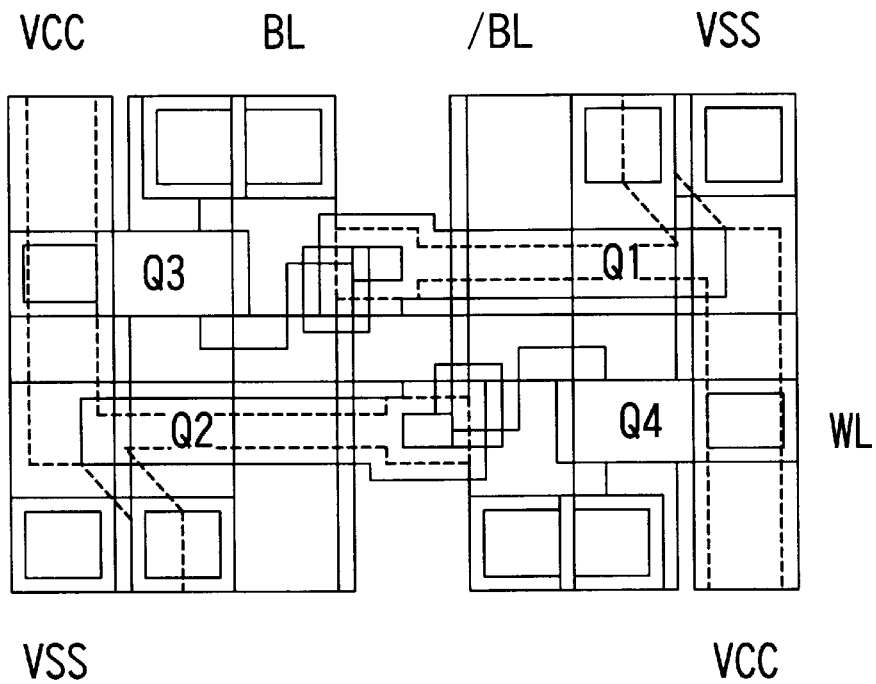
FIG. 13 is a plan view of a semiconductor substrate, on which a SRAM of the present invention is formed.

Referring to FIG. 13, a modified example of a resistive element will be described below.

This resistive element is the same as that of FIG. 1, except for the arrangement on the semiconductor substrate. Therefore, only the portions corresponding to those of FIG. 9 will be described in FIG. 13. The third layer of polysilicon film is deposited on the second interlayer insulating film and patterned to form the wires 18, 19. The wire 18 includes the resistive element R2 and the power supply line Vcc. The resistive element R2 is electrically connected to the gate 31 of the driver transistor Q1 via the opening 16. The wire 19 includes the resistive element R1 and the power supply line Vcc. The resistive element R1 is electrically connected to the gate 32 of the driver transistor Q2 via the opening 17. The resistive elements R1, R2 are arranged in parallel to the gates.

In FIG. 1, the gates are formed in the first layer of polysilicon film, and the word lines WL are formed in the second layer of polysilicon film. In addition, the resistive elements R1, R2 are formed in the third layer of polysilicon film, and the bit lines BL, /BL and the earthing wires Vss are formed in the first layer of aluminum film.

That is, in the preferred embodiment shown in FIG. 1, the first through third layers of polysilicon film and the first layer of aluminum film are utilized for elements and wires. In FIG. 1, the contacts for connecting the bit lines BL, /BL of the aluminum film to the address-selecting transistors Q3, Q4, and the contacts for connecting the earthing wires Vss of the aluminum film to the driver transistors Q1, Q2 are connected to the underlayer of polysilicon film to reduce the aspect ratios of the contacts (i.e., the word lines (WL) 11 as well as the wires 12 through 15 are formed in the second layer of polysilicon film, and these wires serve as transfer portions for electrically connecting the diffusion region serving as the source/drain regions of the transistors to the bit lines BL, /BL and the earthing wires Vss, which are formed on the surface of the semiconductor substrate), and then, the driver transistors Q1, Q2 and the address-selecting transistors Q3, Q4 are connected to the diffusion region.

On the other hand, in the case of the wiring structure shown in FIG. 2, the second polysilicon film is not used as a transfer portion, and the diffusion region is connected directly to the earthing lines or the bit lines. Therefore, the contact regions 41 through 44 are added to the element regions 1, 2 formed on the semiconductor substrate. In order to connect the source region of the transistor Q1 (see FIG. 6) to the earthing wires Vss, the contact region 41 for forming contact holes in the insulating film is formed in the source region 37. In order to connect the source region 38 of the transistor Q2 (see FIG. 6) to the bit line BL, the contact region 43 for forming contact holes in the insulating film is formed in the source region 35. In order to connect the source region 36 of the transistor Q4 (see FIG. 6) to the bit line /BL, the contact region 44 for forming contact holes in the insulating film is formed in the source region 36. Since the contact holes are formed in multi-layer insulating films, the contact holes are deeply formed.

Similar to FIG. 1, in the SRAM having the arrangement shown in FIG. 2, all of the gates of the address-selecting transistors Q3, Q4 and the driver transistors Q1, Q2 are arranged in the same direction and in the direction perpendicular to the bit lines BL, /BL. Moreover, the pair of driver transistors Q1, Q2 are arranged point-symmetrically, and the pair of address-selecting transistors Q3, Q4 are arranged point-symmetrically. The drain regions of the driver transistors are arranged point-symmetrically around the element isolating region on the semiconductor substrate, and the source regions thereof are arranged point-symmetrically around the element isolating region on the semiconductor substrate.

Figure 14:
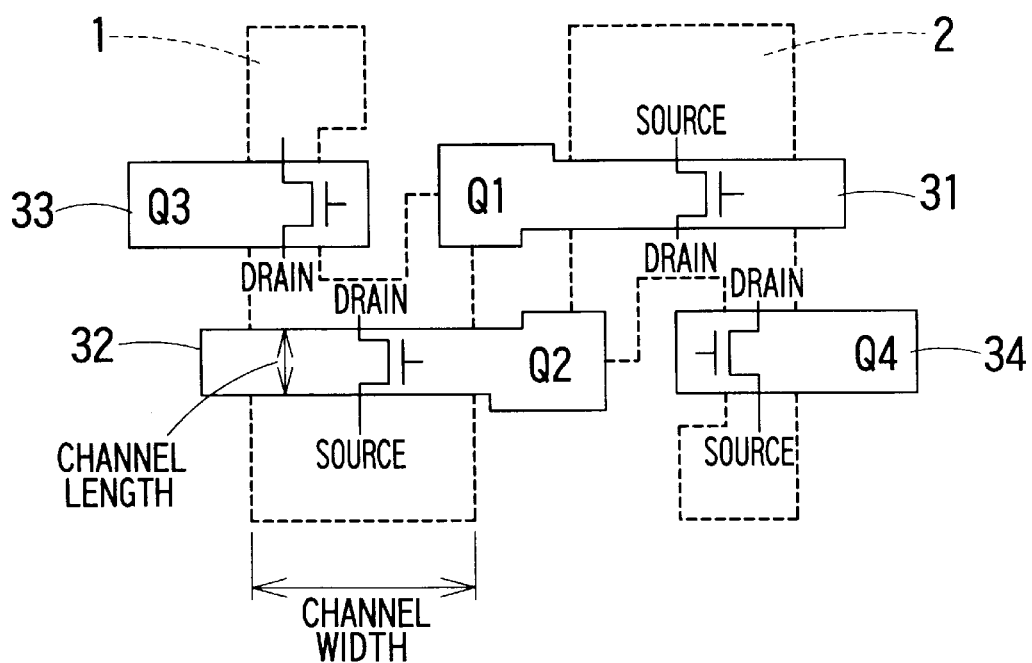
FIG. 14 is a plan view of a semiconductor substrate, on which a SRAM of the present invention is formed.

Referring to FIG. 14, the directions of the transistors will be described below. FIG. 14 is a plan view of a semiconductor substrate of a single SRAM cell, on which element regions and gates are formed.

A single SRAM cell has four transistors Q1 through Q4, and all of the gates 31 through 34 thereof are arranged in the same direction. On the semiconductor substrate, the element regions 1, 2 surrounded by the element isolating region are formed. The gates 31 through 34 are arranged in horizontal directions in FIG. 14 so as to intersect the element regions. The element regions on both sides of the gate serve as the source/drain regions.

If the direction of current flowing through a transistor is defined as the direction of the transistor, all of the transistors Q1 through Q4 are directed in the vertical directions in FIG. 14. Therefore, the directions of the transistors are the same as the direction of the channel length and perpendicular to the direction of the channel width. As described above, according to the present invention, the directions of the gates are perpendicular to the bit lines, so that the directions of the transistors are parallel to the bit lines.

Referring to FIGS. 15 through 20, the second preferred embodiment of the present invention will be described below.

Figure 15:
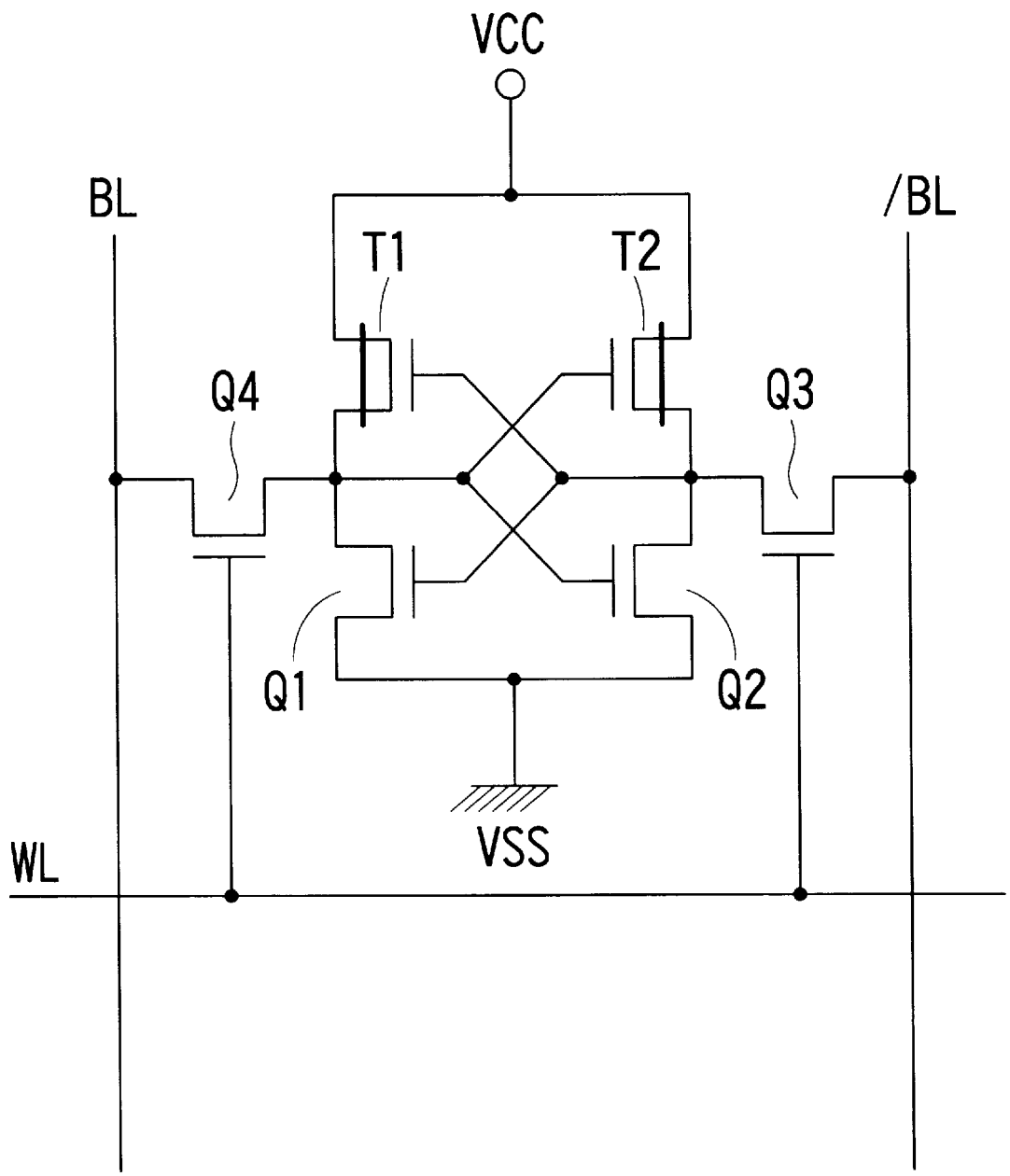
FIG. 15 is a circuit diagram of a TFT load type SRAM.
Figure 16:
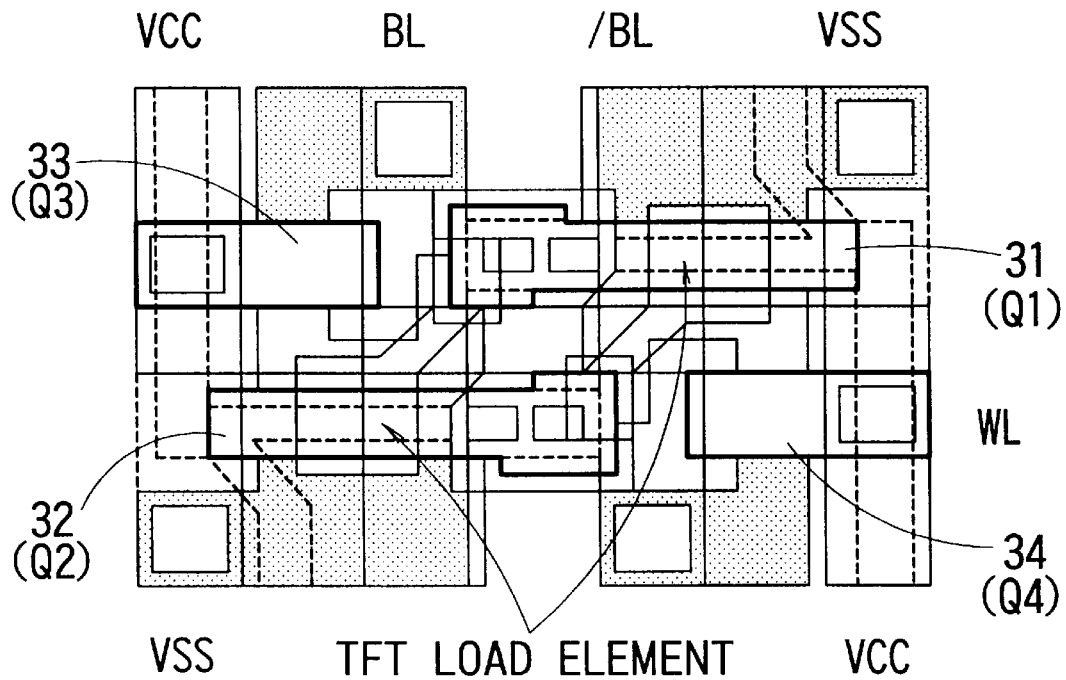
FIG. 16 is a plan view of a semiconductor substrate, on which a SRAM of the present invention is formed.

In this preferred embodiment, a memory cell of a TFT load type SRAM shown in the circuit diagram of FIG. 15 is used. First and second MOS transistors Q1, Q2 form a pair of driver transistors. The drain region of one of the driver transistor Q1, Q2 is connected to the gate of the other driver transistor Q1 or Q2. As load elements for the respective transistors, e.g., TFT transistors T1, T2 are connected to form a flip-flop circuit. One ends of the TFT transistors T1, T2 are commonly connected to a Vcc terminal. The source regions of the driver transistors Q1, Q2 are connected to a Vss terminal. The gates of the TFT transistors T1, T2 are connected to the drain regions of the transistors Q1, Q2, respectively. First and second nodes of the flip-flop circuit are connected to first and second bit lines BL, /BL via wiring address-selecting transistors. The address-selecting transistors are formed by third and fourth MOS transistors Q3, Q4. When a memory cell is selected to carry out writing or readout, the address-selecting transistors Q3, Q4 are turned ON to transmit information between the bit lines BL, /BL and the flip-flop circuit. The gates of the address-selecting transistors Q3, Q4 are commonly connected to a work line WL.

Figure 17:
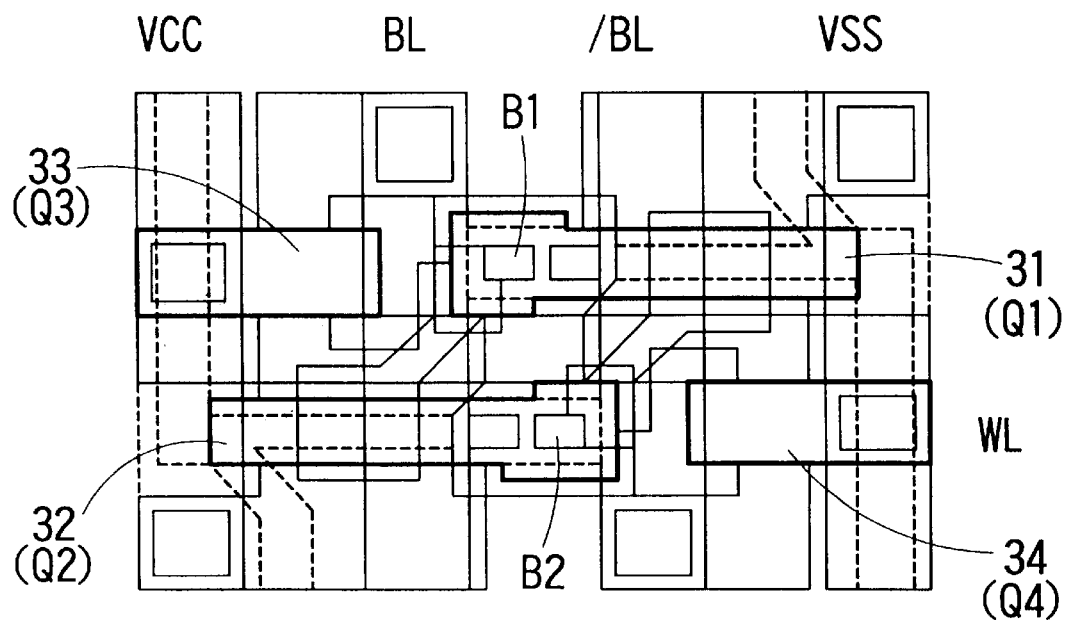
FIG. 17 is a plan view of a semiconductor substrate, on which a SRAM of the present invention is formed.
Figure 18:
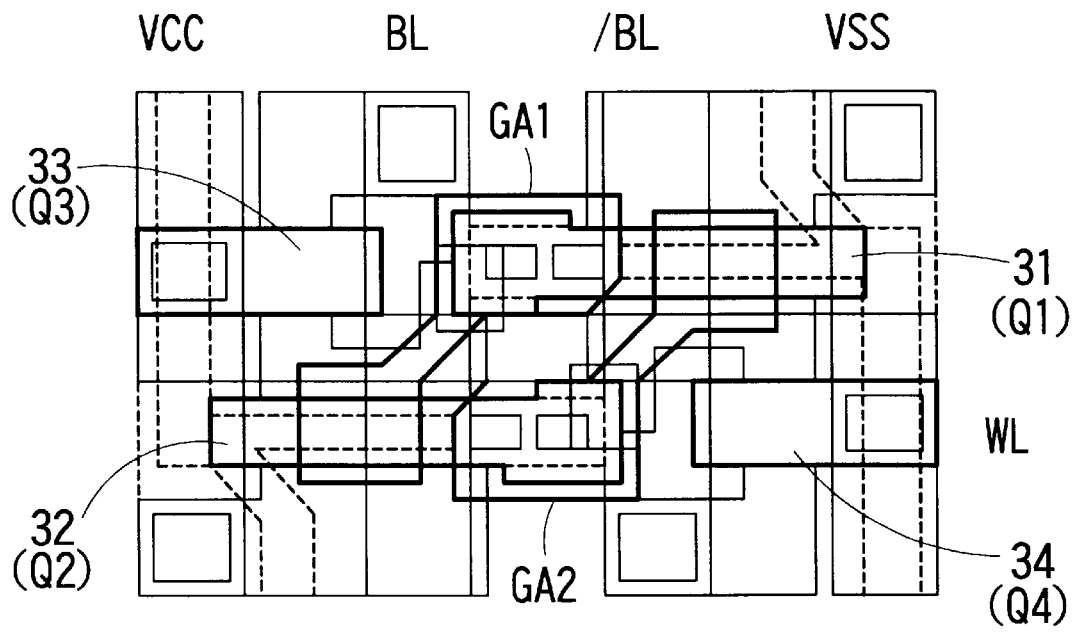
FIG. 18 is a plan view of a semiconductor substrate, on which a SRAM of the present invention is formed.
Figure 19:
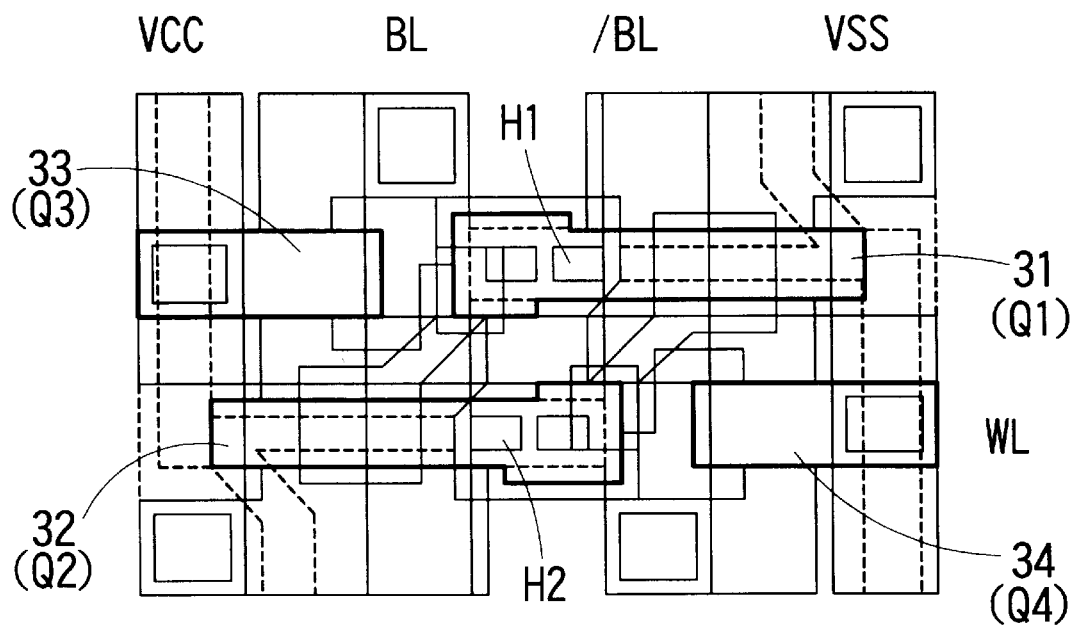
FIG. 19 is a plan view of a semiconductor substrate, on which a SRAM of the present invention is formed.
Figure 20:
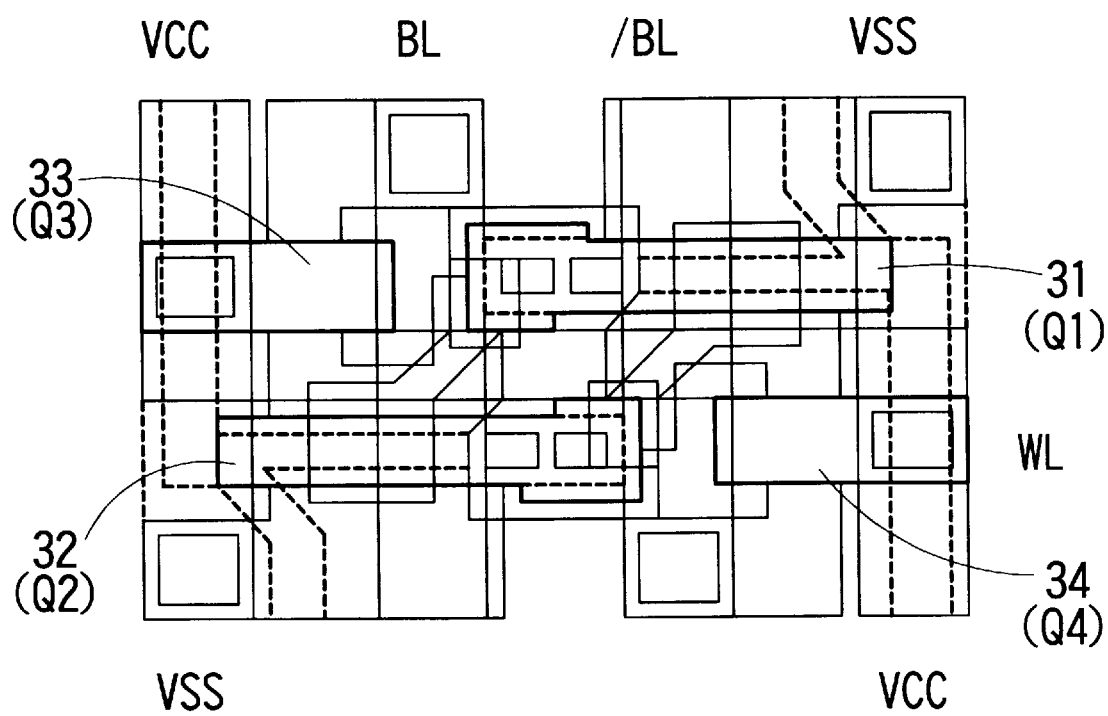
FIG. 20 is a plan view of a semiconductor substrate, on which a SRAM of the present invention is formed.

FIGS. 16 through 20 are plan views illustrating the arrangement of the SRAM cell on the semiconductor substrate. All of the gates of the address-selecting transistors Q3, Q4 and the driver transistors Q1, Q2 are arranged in the same direction and in the direction perpendicular to the bit lines BL, /BL. The pair of the driver transistors Q1, Q2 are arranged point-symmetrically, and the pair of address-selecting transistors Q3, Q4 are also arranged point-symmetrically. The drain regions of the driver transistors Q1, Q2 are arranged point-symmetrically around to the element isolating region on the semiconductor substrate, and the source regions thereof are arranged point-symmetrically around the element isolating region on the semiconductor substrate. The two TFT load transistors are also arranged point-symmetrically. As shown in FIG. 17, an opening B1 for connecting the gate 31 of the transistor Q1 to the TFT gate GA1 (see FIG. 18) is formed in the insulating film, and an opening B2 for connecting the gate 32 of the transistor Q2 to the TFT gate GA2 (see FIG. 18) is formed in the insulating film. As shown in FIG. 18, the TFT gate GA1 and the TFT gate GA2 are formed on the insulating film having these openings. As shown in FIG. 19, openings H1, H2 for connecting the TFT gates GA1, GA2 to TFT polysilicon layers P1, P2 (see FIG. 20) are formed in the insulating film. As shown in FIG. 20, the TFT polysilicon layers P1, P2 are formed in the insulating film having the openings H1, H2. In the case of a usual MOS transistor, the gate thereof is formed of polysilicon or the like. In addition, a channel is arranged via a gate oxide film, and a source/drain (diffusion layer) is arranged on both sides of the channel. On the other hand, in the case of the TFT load element, the TFT gate (hereinafter referred to as a lower gate) is first formed, and then, a Vcc line called TFT polysilicon layer and a region for allowing current to flow are formed thereon.

Figure 21:
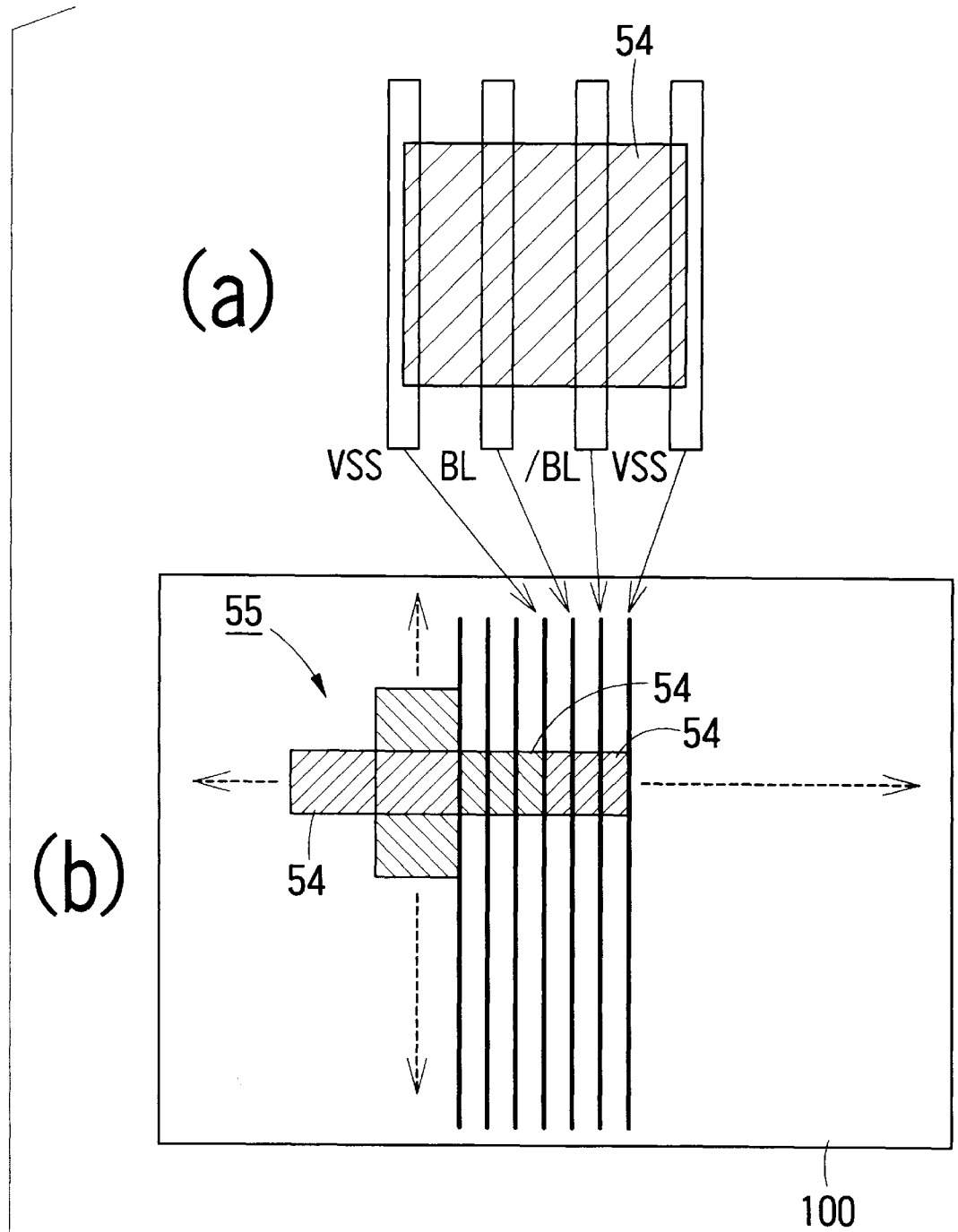
FIGS. 21(a) and 21(b) a plan view of a semiconductor substrate and a SRAM formed thereon according to the present invention.
Figure 22:
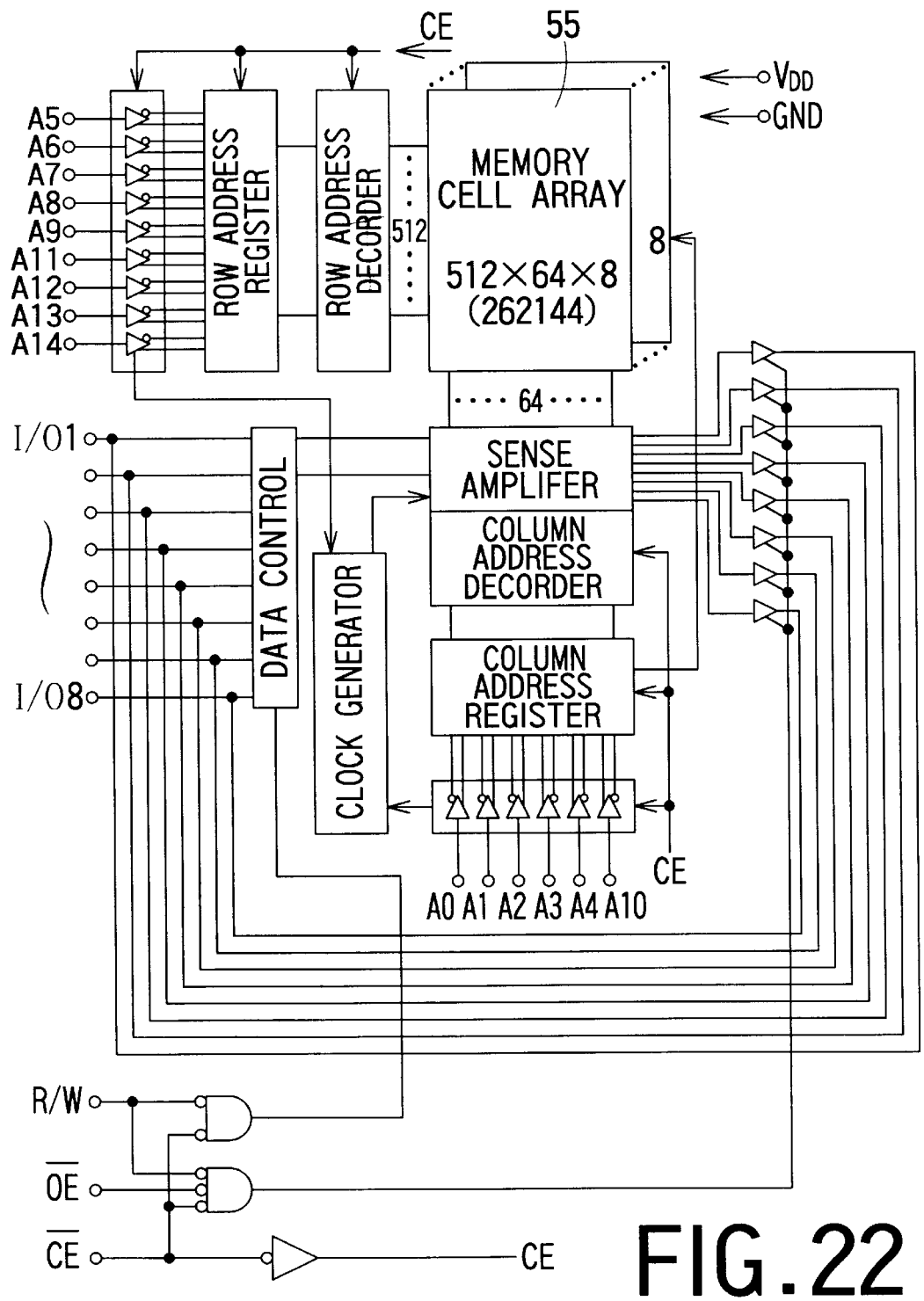
FIG. 22 is a circuit diagram of a SRAM according to the present invention.
Figure 23:
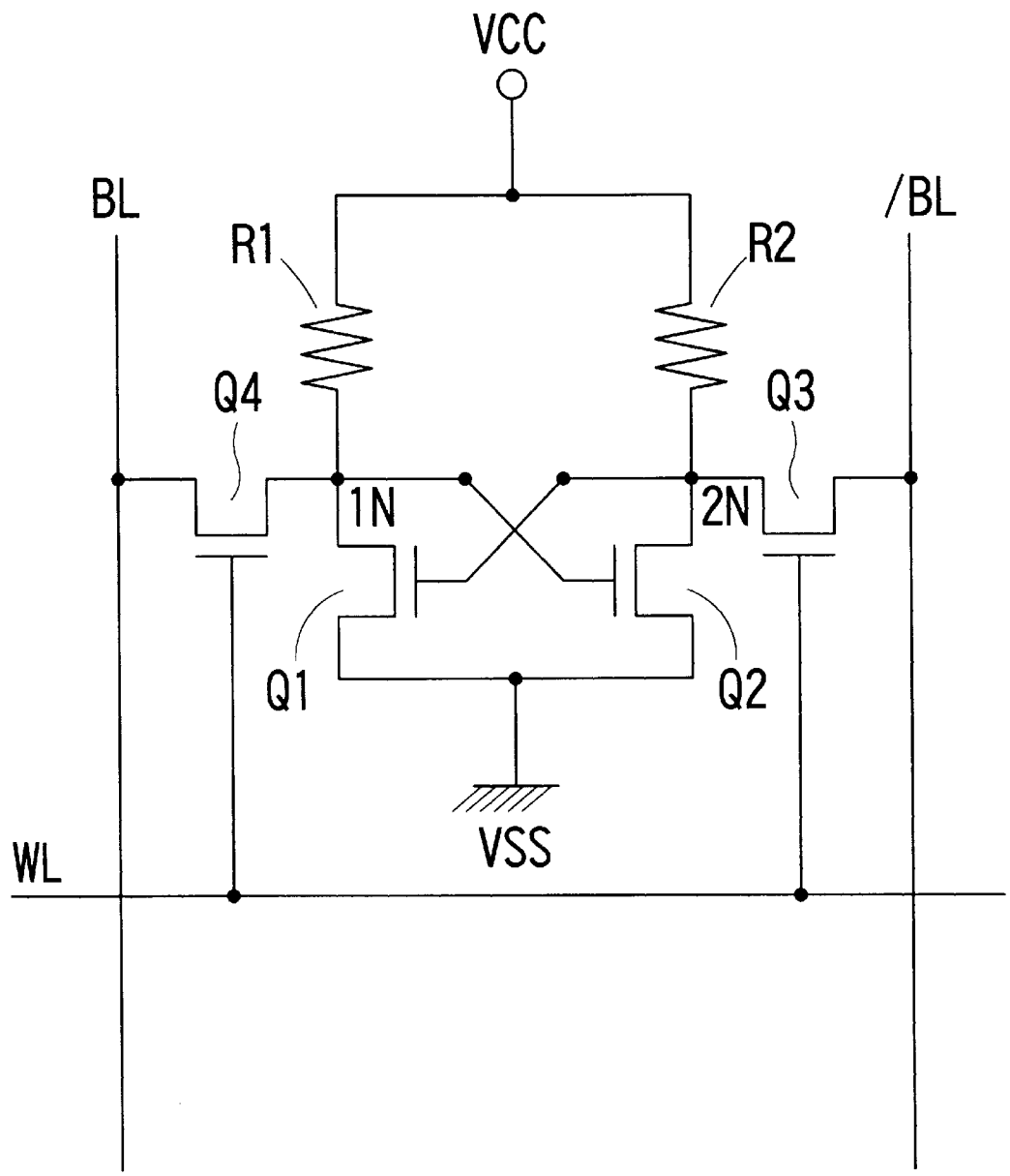
FIG. 23 is a circuit diagram of a high-resistance load type SRAM.
Figure 24:
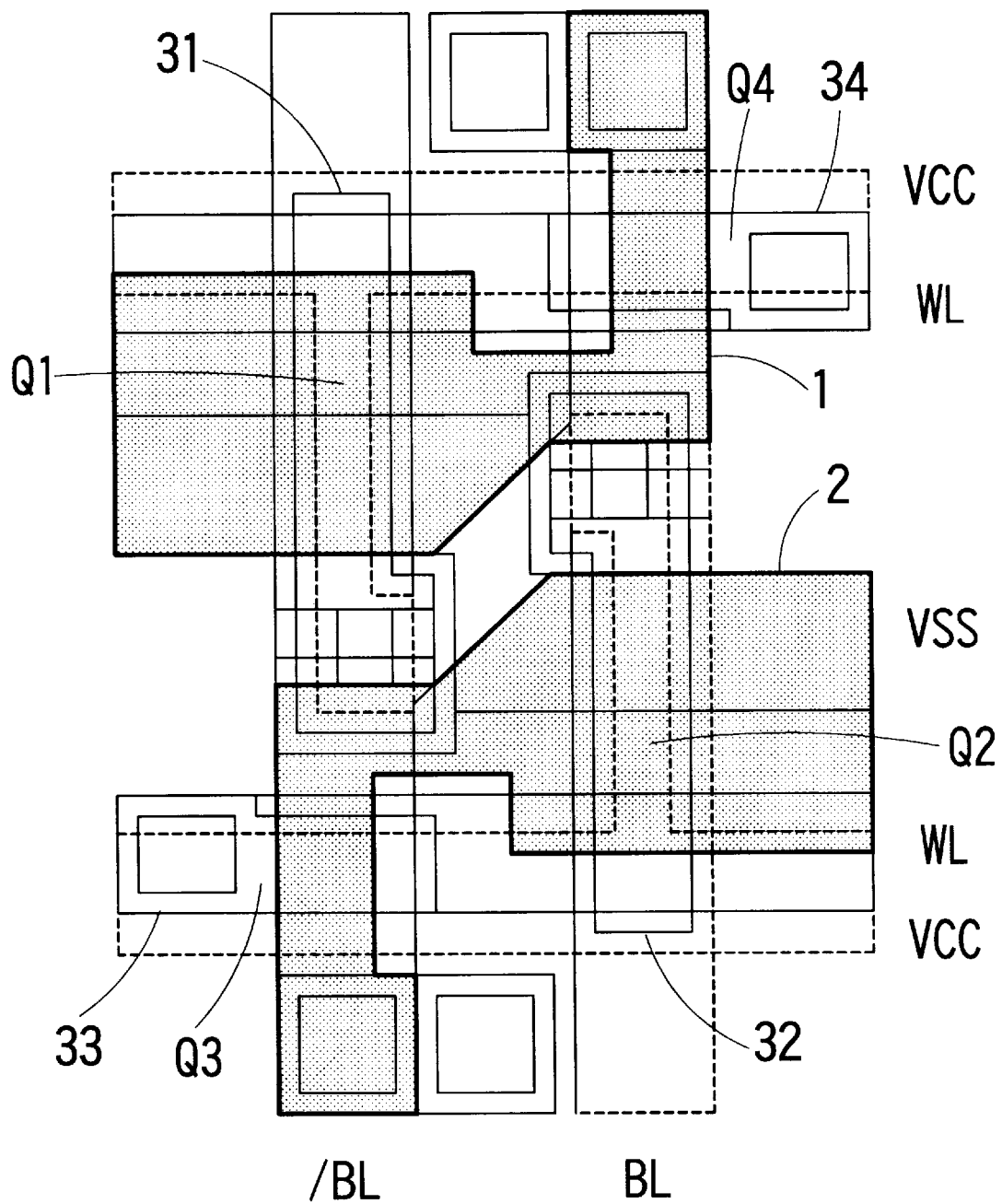
FIG. 24 is a plan view of a semiconductor substrate, on which the SRAM of FIG. 23 is formed.

Referring to FIGS. 21 and 22, the arrangement of the SRAM cell on the semiconductor substrate will be described below. FIG. 21 is a plan view of the SRAM and the semiconductor substrate, and FIG. 22 is a circuit diagram of the SRAM.

As shown in FIGS. 21(a) and 21(b), the memory cell of the SRAM (SRAM cell) 54 shown in FIGS. 1 and 2 extends in lateral directions. The bit lines BL, /BL are arranged and formed thereon at the center portion thereof. The earthing lines Vss are provided at the end portions of the SRAM cell on both sides of the bit lines. A plurality of unit cells, each of which comprises the SRAM cell 54, are formed on the semiconductor substrate 100 to form a cell array 55. This cell array 55 forms a part of a SRAM circuit shown in FIG. 22.

In the SRAM cell according to the present invention, since the directions of the gates of the pair of driver transistors and the directions of the gates of the pair of address-selecting transistors are perpendicular to the bit lines, the aspect ratio for the cell size is reversed from that for the conventional SRAM cell so that the lateral length of the cell is longer than the longitudinal length thereof. Thus, if the longitudinal length of the cell is reduced, the length of the bit line can be decreased, so that the accelerating can be accomplished. In addition, since the lateral length of the cell is longer than that of the conventional cell, the wiring regions for a column selecting circuit and a sense amplifier and the degree of freedom for the element regions, which are determined by the lateral size of the cell, can be increased to reduce the chip size. In addition, since all of the active elements are arranged point-symmetrically, the bi-stability of the flip-flop can be improved. In particular, since the address-selecting transistors are arranged point-symmetrically, the "gm" of one of the address-selecting transistors is the same as that of the other address-selecting transistor. Since the wire for connecting the two gates of the pair of address-selecting transistors is formed in the wiring layer above the gates, a single wire may be used, so that there is no problem of phase difference. For example, all of "0" and "1" of the cell in the respective word lines are the same, so that there is no difference in capacity on the basis of the word line. In addition, since a single wire may be used for connecting the two gates of the pair of address-selecting transistors, the cell size can be reduced. The earthing wires Vss are formed in the same layer as that of the bit lines. Since the two earthing wires Vss are arranged on both sides of the bit lines BL, /BL to be connected to the source regions of the driver transistors, the resistance of the earthing wire Vss can be sufficiently decreased in comparison with that of the conventional cell. Therefore, the stability of the flip-flop can be considerably improved, and the low-voltage operation and the data-hold characteristics can be considerably improved. In addition, since the bit lines are shielded from the adjacent cells by the earthing wires Vss, there is no influence of the coupling with the adjacent bit lines unlike conventional cell, so that the bit line operation can be stabilized.

Since the distance between the source region of the address-selecting transistor and the drain region of the driver transistor is decreased to reduce resistance, the stability can be improved.

Since the gates of the address-selecting transistor and the driver transistor are arranged in parallel, it is difficult to shift the arrangement in the a process for producing the semiconductor memory device, so that the characteristics are stabilized.

Since the areas of the node of the cell and the region for the source/drain are decreased, the absorbed amount of carriers generated by alpha rays is small. Therefore, software errors are decreased, so that the characteristics are stabilized.

In the SRAM cell according to the present invention, since the directions of the gates of the pair of driver transistors and the directions of the gates of the pair of address-selecting transistors are perpendicular to the bit lines, the aspect ratio for the cell size is reversed from that for the conventional cell so that the lateral length of the cell is longer than the longitudinal length thereof. As a result, the length of the bit line is decreased to achieve the higher speed operation and to reduce the chip size. Since all of the pair of active elements are arranged point-symmetrically, the bi-stability of the flip-flop can be improved. In addition, since the resistance of the earthing wire is sufficiently decreased so as to be smaller than that of the conventional earthing wire, the stability of the flip-flop is considerably improved, and the low-voltage operation and the data-hold characteristics are considerably improved. Moreover, since the bit lines are shielded from the adjacent cells by the earthing wires Vss, there is no influence of the coupling with the adjacent bit lines unlike conventional cell, so that the bit line operation can be stabilized.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device having a memory cell formed on a semiconductor substrate, said memory cell comprising:

a flip-flop including first and second load elements and a pair of driver transistors, said a pair of driver transistors including a first MOS transistor and a second MOS transistor, a gate of said first MOS transistor being connected to a drain of said second MOS transistor and a gate of said second MOS transistor being connected to a drain of said first MOS transistor, each of said first and second MOS transistors having a source connected to a low-voltage-side power supply line, and one end of said first load element being connected to said drain of said first MOS transistor and the other end thereof being connected to a high-voltage-side power supply line, one end of said second load element being connected to said drain of said second MOS transistor and the other end thereof being connected to said high-voltage-side power supply line; and a pair of address-selecting transistors including a third MOS transistor and a fourth MOS transistor, one of a source and a drain of said fourth MOS transistor being connected to a first bit line and the other of said source and said drain of fourth MOS transistor being connected to said drain of said first MOS transistor, one of a source and a drain of said third MOS transistor being connected to a second bit line and the other of said source and said drain of said third MOS transistor being connected to said drain of said second MOS transistor, wherein said first and second bit lines and said high-voltage-side and low-voltage-side power supply lines extend in a predetermined direction, the directions of channel lengths of said first, second, third and fourth MOS transistors being the same as said predetermined direction, all of said first and second bit lines, said high-voltage-side and low-voltage-side power supply lines, said first, second, third and fourth MOS transistors, and first and second load elements of said memory cell being arranged point-symmetrically with respect to a central point on a plane of a memory cell forming region on said semiconductor substrate, and wherein said first and second bit lines intervene between said high-voltage-side and low-voltage-side power supply lines, and wherein said high-voltage-side and low-voltage-side power supply lines are opposite to said first and second load elements, respectively, through capacitances formed between said low-voltage-side power line and said first load element and between said high-voltage-side power line and said second load element, respectively.

2. A semiconductor memory device as set forth in claim 1, wherein said first and second MOS transistors are arranged point-symmetrically with respect to said central point on said plane of said memory cell forming region on said semiconductor substrate.

3. A semiconductor memory device as set forth in claim 2, wherein said third and fourth MOS transistors are arranged point-symmetrically with respect to said central point on said plane of said memory cell forming region on said semiconductor substrate.

4. A semiconductor memory device as set forth in claim 3, wherein said first and second load elements are arranged point-symmetrically with respect to said central point on said plane of said memory cell forming region on said semiconductor substrate.

5. A semiconductor memory device as set forth in claim 4, which further comprises:

an insulating film formed so as to coat said gate of said pair of address-selecting MOS transistors; and a word line, formed on said insulating film, for connecting a gate of each of said address-selecting MOS transistors.

6. A semiconductor memory device as set forth in claim 5, wherein said bit lines and said low-voltage-side power supply line are formed from a conductive layer formed in a process for producing the semiconductor memory device.

7. A semiconductor memory device as set forth in claim 6, wherein said low-voltage-side power supply line having portions which are arranged at both ends of said memory cell, said bit lines being arranged between said portions of said low-voltage-side power supply line.

8. A semiconductor memory device as set forth in claim 7, wherein said conductive layer is an aluminum layer.

9. A semiconductor memory device as set forth in claim 8, wherein said high-voltage-side power supply line and said load elements are formed by an ion implantation into a polysilicon conductive layer formed in said process for producing the semiconductor memory device.

10. A semiconductor memory device as set forth in claim 8, wherein said each load element is a TFT load type transistor.

11. A semiconductor memory device as set forth in claim 1, wherein a plurality of memory cells are arranged on said semiconductor substrate in the form of a matrix.

* * * * *